(12) United States Patent
Subramanya et al.

(10) Patent No.: US 12,276,827 B2
(45) Date of Patent: Apr. 15, 2025

(54) LOW Z-HEIGHT LED ARRAYS WITH CONTROLLABLE LIGHT BEAMS

(71) Applicant: LUMILEDS LLC, San Jose, CA (US)

(72) Inventors: Sudhir Subramanya, Dublin, CA (US); Willem Sillevis-Smitt, San Jose, CA (US); Frederic Diana, San Jose, CA (US); Charles Schrama, San Jose, CA (US); Alan McReynolds, San Jose, CA (US); Yifeng Qiu, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 237 days.

(21) Appl. No.: 17/703,266

(22) Filed: Mar. 24, 2022

(65) Prior Publication Data
US 2022/0214493 A1     Jul. 7, 2022

Related U.S. Application Data

(63) Continuation of application No. 16/584,641, filed on Sep. 26, 2019, now Pat. No. 11,333,821.

(30) Foreign Application Priority Data

Dec. 11, 2018    (EP) ..................................... 18211515

(51) Int. Cl.
*F21V 8/00*     (2006.01)
*F21K 9/23*     (2016.01)
(Continued)

(52) U.S. Cl.
CPC .............. *G02B 6/0073* (2013.01); *F21K 9/23* (2016.08); *F21V 5/004* (2013.01);
(Continued)

(58) Field of Classification Search
CPC .. G02B 6/0073; G02B 6/0035; G02B 6/0085; F21V 29/75; F21V 29/763; F21V 5/004;
(Continued)

(56) References Cited

U.S. PATENT DOCUMENTS 6,948,838 B2   9/2005  Künstler
7,229,199 B2   6/2007  Lee et al.
(Continued)

FOREIGN PATENT DOCUMENTS

DE         10205779 A1    10/2003
WO      2009/104123 A1     8/2009
(Continued)

OTHER PUBLICATIONS

International Search Report corresponding to PCT/US2019/053656, Nov. 27, 2019, 6 pages.
(Continued)

*Primary Examiner* — Joseph L Williams
*Assistant Examiner* — Hana S Featherly

(57) ABSTRACT

A light source useful for architectural lighting, general lighting, street lighting, or other lighting applications includes a plurality of light emitting diodes. A least some light emitting diodes can be sized between 30 microns and 500 microns. A plurality of micro-optics sized less than 1 millimeter are positioned over at least some of the plurality of light emitting diodes. A controller may be connected to selectively power groups of the plurality of light emitting diodes to provide different light beam patterns.

16 Claims, 9 Drawing Sheets

Related U.S. Application Data

(60) Provisional application No. 62/738,607, filed on Sep. 28, 2018.

(51) Int. Cl.

| | | |
|---|---|---|
| *F21V 5/00* | (2018.01) | |
| *F21V 19/00* | (2006.01) | |
| *F21V 29/75* | (2015.01) | |
| *F21V 29/76* | (2015.01) | |
| *H01L 27/15* | (2006.01) | |
| *F21Y 105/16* | (2016.01) | |
| *F21Y 113/13* | (2016.01) | |
| *F21Y 115/10* | (2016.01) | |

(52) U.S. Cl.
CPC .......... *F21V 19/0025* (2013.01); *F21V 29/75* (2015.01); *F21V 29/763* (2015.01); *G02B 6/0035* (2013.01); *H01L 27/156* (2013.01); *F21Y 2105/16* (2016.08); *F21Y 2113/13* (2016.08); *F21Y 2115/10* (2016.08); *G02B 6/0085* (2013.01)

(58) Field of Classification Search
CPC ...... F21V 19/0025; F21K 9/23; H01L 27/156; F21Y 2105/16; F21Y 2113/13; F21Y 2115/10
USPC .......................................................... 362/555
See application file for complete search history.

(56) References Cited

U.S. PATENT DOCUMENTS

| | | |
|---|---|---|
| 8,573,822 B2 | 11/2013 | Ishihara |
| 8,746,909 B2 | 6/2014 | Chen et al. |
| RE47,241 E | 2/2019 | D'Evelyn et al. |
| 11,194,091 B2 | 12/2021 | Subramanya et al. |
| 2007/0058359 A1 | 3/2007 | Saitoh et al. |
| 2009/0009506 A1 | 1/2009 | Lee et al. |
| 2011/0315956 A1 | 12/2011 | Tischler et al. |
| 2013/0141909 A1* | 6/2013 | Ashdown .................. F21V 5/08 362/240 |
| 2015/0227790 A1 | 8/2015 | Smits |
| 2015/0295154 A1 | 10/2015 | Tu et al. |
| 2016/0123541 A1 | 5/2016 | Quilici et al. |
| 2016/0298822 A1 | 10/2016 | Michiels et al. |
| 2016/0363747 A1 | 12/2016 | Krijn et al. |
| 2017/0102125 A1 | 4/2017 | Saito |
| 2017/0254518 A1 | 9/2017 | Vasylyev |
| 2018/0135463 A1 | 5/2018 | Nambara |
| 2018/0164473 A1* | 6/2018 | Ni ......................... H05B 33/04 |
| 2018/0245776 A1 | 8/2018 | Gladden et al. |
| 2020/0103091 A1 | 4/2020 | Subramanya et al. |
| 2020/0103581 A1 | 4/2020 | Subramanya et al. |
| 2020/0105827 A1 | 4/2020 | Subramanya et al. |

FOREIGN PATENT DOCUMENTS

| | | |
|---|---|---|
| WO | 2018/185475 A1 | 10/2018 |
| WO | 2020/069443 A1 | 4/2020 |

OTHER PUBLICATIONS

Written Opinion of the International Searching Authority corresponding to PCT/US2019/053656, Nov. 27, 2019, 6 pages.

USPTO Non-final Office Action issued in U.S. Appl. No. 16/584,641 dated Feb. 17, 2021; 21 pages.

USPTO Non-final Office Action issued in U.S. Appl. No. 16/584,635 dated Oct. 1, 2020; 20 pages.

USPTO Final Office Action issued in U.S. Appl. No. 16/584,635 dated Feb. 4, 2021, 24 pages.

USPTO Final Office Action issued in U.S. Appl. No. 16/584,641 dated Oct. 25, 2021; 19 pages.

USPTO Notice of Allowance issued in U.S. Appl. No. 16/584,641 dated Dec. 22, 2021; 9 pages.

USPTO Non-final Office Action issued in U.S. Appl. No. 16/584,628 dated Jul. 8, 2021; 9 pages.

USPTO Notice of Allowance issued in U.S. Appl. No. 16/584,635 dated Aug. 18, 2021; 7 pages.

USPTO Final Office Action issued in U.S. Appl. No. 16/584,628 dated Sep. 16, 2021; 9 pages.

The extended European search report corresponding to EP18211515.4 dated Nov. 4, 2019, 7 pages.

USPTO Notice of Allowance issued in U.S. Appl. No. 16/584,628 dated Feb. 2, 2022; 7 pages.

\* cited by examiner

LOW Z-HEIGHT LED ARRAYS WITH CONTROLLABLE LIGHT BEAMS

CROSS-REFERENCE TO RELATED APPLICATIONS

This application is a continuation of U.S. patent application Ser. No. 16/584,641 filed Sep. 26, 2019, which claims benefit of priority to U.S. Provisional Patent Application No. 62/738,607 filed Sep. 28, 2018 and to European Patent Application No. 18211515.4 filed Dec. 11, 2018. Each of the applications identified in this paragraph is incorporated herein by reference in its entirety.

This application is also related to U.S. patent application Ser. No. 16/584,628 filed Sep. 26, 2019 and to U.S. patent application Ser. No. 16/584,635 filed Sep. 26, 2019.

TECHNICAL FIELD

The present disclosure relates generally to LED lighting systems. In certain embodiments, flexible low Z-height LED arrays having multiple light beam capability are described.

BACKGROUND

Ceiling or surface mounted area light panels suitable for home, retail, office, or architectural installation are widely available. Such systems often include large fluorescent tubes or multiple halogen lights positioned several centimeters distant from a light diffuser panel. While suitable for many applications, such lighting systems require a substantial Z-height, are ill suited for providing beam lighting that can specifically highlight a selected area, and are not able to easily limit light intensity provided to a selected area.

To alleviate such deficiencies, multiple LED directed lighting systems capable of providing multiple beams of a light can be used. Unfortunately, such directed lighting systems do not provide a relatively uniform appearance, with multiple LEDs and optics can provide an unsatisfactory cluttered appearance. Typically, the LED package appearance and projected light of such LED systems is not uniform, with bright spots and shadowing being present in the LED package, and individual projected beams being recognizable in illuminated areas. Further, due to separated light beams, illuminated objects will appear to have multiple shadows in response to direct illumination. LED systems that have a low Z-height, present a uniform visual appearance, and minimize shadowing or other visual artifacts of multiple beams are needed.

SUMMARY

In one embodiment, a light source useful for architectural lighting, general lighting, street lighting, or other lighting applications includes a plurality of light emitting diodes. A least some light emitting diodes can be sized between 30 microns and 500 microns. A plurality of micro-optics sized less than 1 millimeter are positioned over at least some of the plurality of light emitting diodes. At least some of the plurality of micro-optics are grouped to provide at least two directional light beams and a controller is connected to selectively power groups of the plurality of light emitting diodes to provide different light beam patterns.

In one embodiment a flexible substrate is positioned to support the plurality of light emitting diodes and the plurality of micro-optics, with the flexible substrate bendable to allow differing directionality of light beams. In an alternative embodiment a flexible light guide plate defines the plurality of micro-optics and is positionable over at least some of the plurality of light emitting diodes.

In one embodiment, a plurality of light emitting diodes are attached or positioned near a light guide plate. At least some light emitting diodes are sized between 30 microns and 500 microns and can be attached to a printed circuit board or other suitable substrate. A plurality of micro-optics can be associated with a light guide plate and are sized less than 1 millimeter, with each micro-optic positioned over at least one of the plurality of light emitting diodes. The combined height of each of the plurality of light emitting diodes, their supporting substrate, and associated micro-optics is less than 1 centimeter. In some embodiments, at least some of the combinations of light emitting diodes and micro-optics associated with the light guide plate are positioned within a distance to each other sufficient to provide at least one substantially uniform light beam.

Optical structures can include a plurality of micro-optics defined or attached to the light guide plate and sized less than 1 millimeter. The micro-optics can be positioned over at least one of the plurality of light emitting diodes. Typically, the micro-optics are sized to be similar or larger in size than the light emitting diodes. In some embodiments, each combination of light emitting diode and associated micro-optic can be positioned within a distance to each other sufficient to both present a substantially uniform visual appearance and provide a substantially uniform light beam. This distance can be selected so the combined light emitting diode and associated micro-optic are positioned to be separated by no more than a Rayleigh limit distance calculated for a user at a normal distance from the light source. In some embodiments, each of the plurality of light emitting diodes are positioned at least 1 millimeter apart.

In some embodiments a controller is connected to selectively power groups of the plurality of light emitting diodes to provide different light beam patterns.

In some embodiments the height of the light emitting diodes, their supporting substrate and electrical traces, and associated micro-optics is less than 5 millimeters.

In some embodiments light emitting diodes can be embedded in a solid or a flexible substrate, which can be at least in part transparent. For example, the light emitting diodes can be at least partially embedded in glass, ceramic, or polymeric materials. At least some of the plurality of light emitting diodes can be individually controlled through connected electrical traces. In other embodiments, groups or sub-groups of light emitting diodes can be controlled together.

In some embodiments the plurality of light emitting diodes can have distinct non-white colors. For example, at least four of the plurality of light emitting diodes can be RGBY groupings of light emitting diodes.

In another embodiment, at least two of the plurality of light emitting diodes are positionable under a single micro-optic. Alternatively, each light emitting diodes can be positioned under a single micro-optic. Some of the plurality of light emitting diodes can be positioned under a single on-axis micro-optic, while others can be positioned under a single off-axis micro-optic. In some embodiments the micro-optics are defined in an optical sheet positionable over at least some of the plurality of light emitting diodes.

DETAILED DESCRIPTION

Figure 1A:
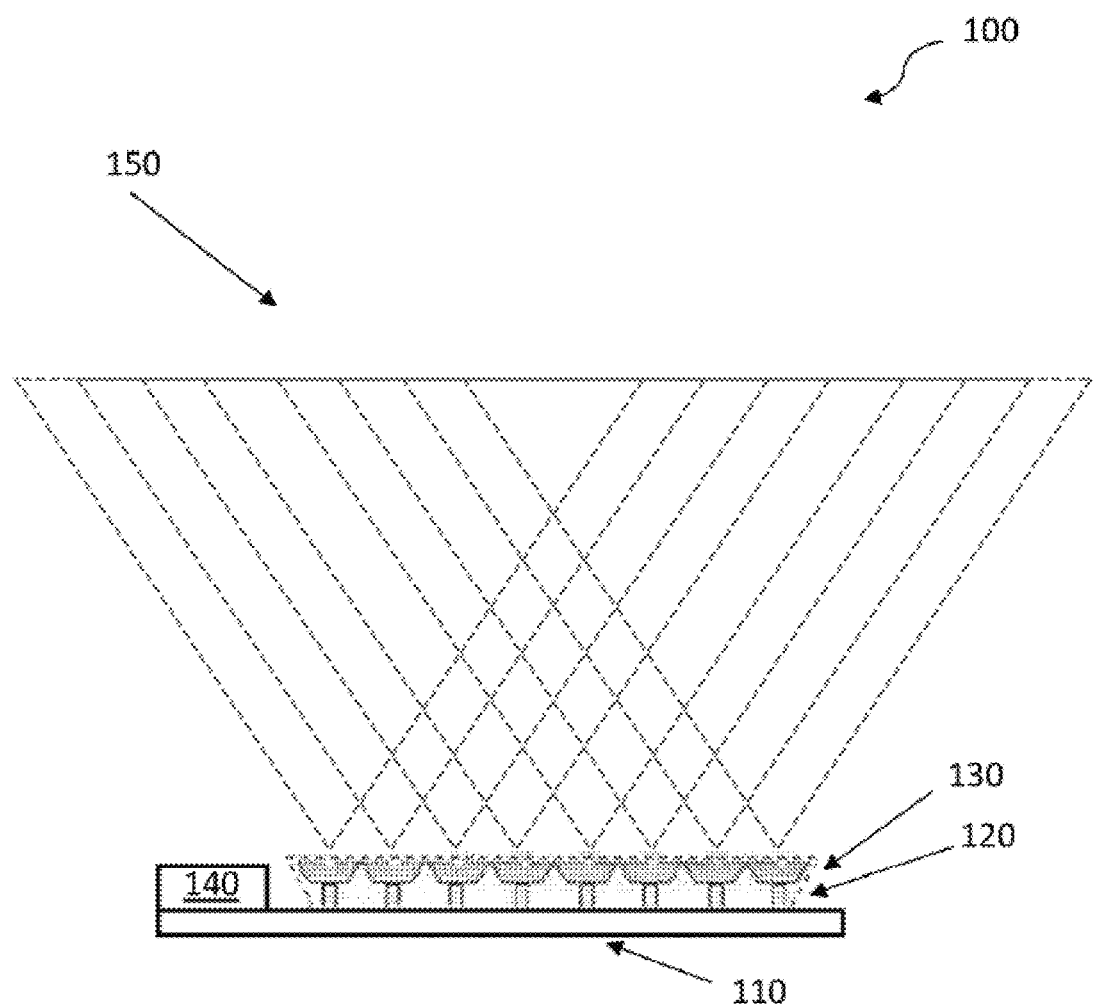
FIG. 1A is a diagram illustrating a LED illumination system with multiple millimeter-scale spaced apart LEDs and micro-optics supported by a substrate.

FIG. 1A is a diagram illustrating a LED illumination system 100 with multiple millimeter-scale spaced-apart LEDs 120 that form a sparse array and associated micro-optics 130 supported by a substrate 110. LED activation and light intensity can be controlled by controller 140. Light emitted from LEDs 120 follow light beam paths 150. The light beam paths can be substantially distinct or at least partially overlapping as indicated in FIG. 1. In some embodiments, the light beams can be used to illuminate a light diffuser panel. In other embodiments to be discussed with respect to FIG. 5, the LEDs 120 can be used to direct light into a light guide plate.

In some embodiments, at least some LEDs 120 are sized between 30 microns and 500 microns in length, width, and height. The micro-optics 130 are sized to be less than 1 millimeter in length, width, and height and are positioned over at least some of the LEDs 120. Typically, the micro-optics are sized to be similar or larger in size than the LEDs 120. In some embodiments the height of the LEDs 120, their supporting substrate and any electrical traces, and associated micro-optics 130 is less than 5 millimeters in combination.

The controller 140 is connected to selectively power groups LEDS 120 to provide different light beam patterns 150. The controller 140 can be mounted on, beneath, or adjacent to substrate 110. Alternatively, the controller can be mounted separately from the substrate 110 and use wired connections, board connected electrical traces, or another suitable interconnect mechanism. The LED controller 140 can include necessary circuitry so as to enable the operation of the plurality of LEDs 120. The LED controller can be unitary or be composed of multiple distinct modules in wired or wireless interconnection. For example, the LED controller 140 can include a separate power supply, a wireless interconnect, and remote logic on a dedicated light interface device or app supported by a smartphone.

The substrate 110 can include a laminated printed circuit board, a ceramic board, glass board, or plastic board. The substrate can be rigid or flexible. Furthermore, the substrate 110 can include the necessary traces and circuitry to enable individual or grouped operation of the LEDs 120. Electrical connection between controller 140 and LEDs 120 can be formed by direct wiring, electrical trace layout, side or bottom vias, or suitable combinations thereof. In certain embodiments, transparent conductors such as indium tin oxide (ITO) can be used to form top or side contacts.

In some embodiments, each LED can be separately controlled by controller 140, while in other embodiments groups of LEDs can be controlled as a block. In still other embodiments, both single LEDs and groups of LEDs can be controlled. To reduce overall data management requirements, the controller 140 can be limited to on/off functionality or switching between relatively few light intensity levels. In other embodiments, continuous changes in lighting intensity are supported. Both individual and group level control of light intensity is contemplated. In one embodiment, overlapping or dynamically selected zones of control are also possible, with for example, overlapping groups of LEDs 120 being separately controllable despite having common LEDs depending on lighting requirements. In one embodiment, intensity can be separately controlled and adjusted by setting appropriate ramp times and pulse width for each LED using a pulse width modulation module within controller 140. This allows staging of LED activation to reduce power fluctuations, and to provide superior luminous intensity control.

The LEDs 120 can include but are not limited to LEDs formed of sapphire or silicon carbide. The LEDs 120 can be formed from an epitaxially grown or deposited semiconductor n-layer. A semiconductor p-layer can then be sequentially grown or deposited on the n-layer, forming an active region at the junction between layers. Semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials. In certain embodiment, laser light emitting elements can be used.

Color of emitted light from the LEDs 120 can be modified using a phosphor contained in glass, or as a pre-formed sintered ceramic phosphor, which can include one or more wavelength converting materials able to create white light or monochromatic light of other colors. All or only a portion of the light emitted by the LEDs 120 may be converted by the wavelength converting material of the phosphor. Unconverted light may be part of the final spectrum of light, though it need not be. Examples of common devices include a blue-emitting LED segment combined with a yellow-emitting phosphor, a blue-emitting LED segment combined with green- and red-emitting phosphors, a UV-emitting LED segment combined with blue- and yellow-emitting phosphors, and a UV-emitting LED segment combined with blue-, green-, and red-emitting phosphors. In some embodiments, individually controllable RGB (three LEDs) or RGBY (four LEDs) can be positioned under a single micro-optic. This allows for precise color control of emitted light. Typically, such RGB LEDs are spaced sufficiently far apart that color mixing will occur in the far field.

Direction, beam width, and beam shape of light emitted from each LED 120 can be modified by micro-optics 130. Micro-optics 130 can be a single optical element or a multiple optic elements. Optical elements can include converging or diverging lenses, aspherical lens, Fresnel lens, or graded index lens, for example. Other optical elements such as mirrors, beam diffusers, filters, masks, apertures, collimators, or light waveguides are also included. Micro-optics 130 can be positioned at a distance from the LEDs that allows receipt and redirection of light from multiple LEDs 120. Alternatively, micro-optics 130 can be set atop each LED 120 to individually guide, focus, or defocus emitted LED 120 light. Micro-optics 130 can be directly attached to the LEDs 120, attached to LEDs 120 via a transparent interposer or plate, or held at a fixed distance from LEDs 120 by surrounding substrate attachments (not shown).

Figure 1B:
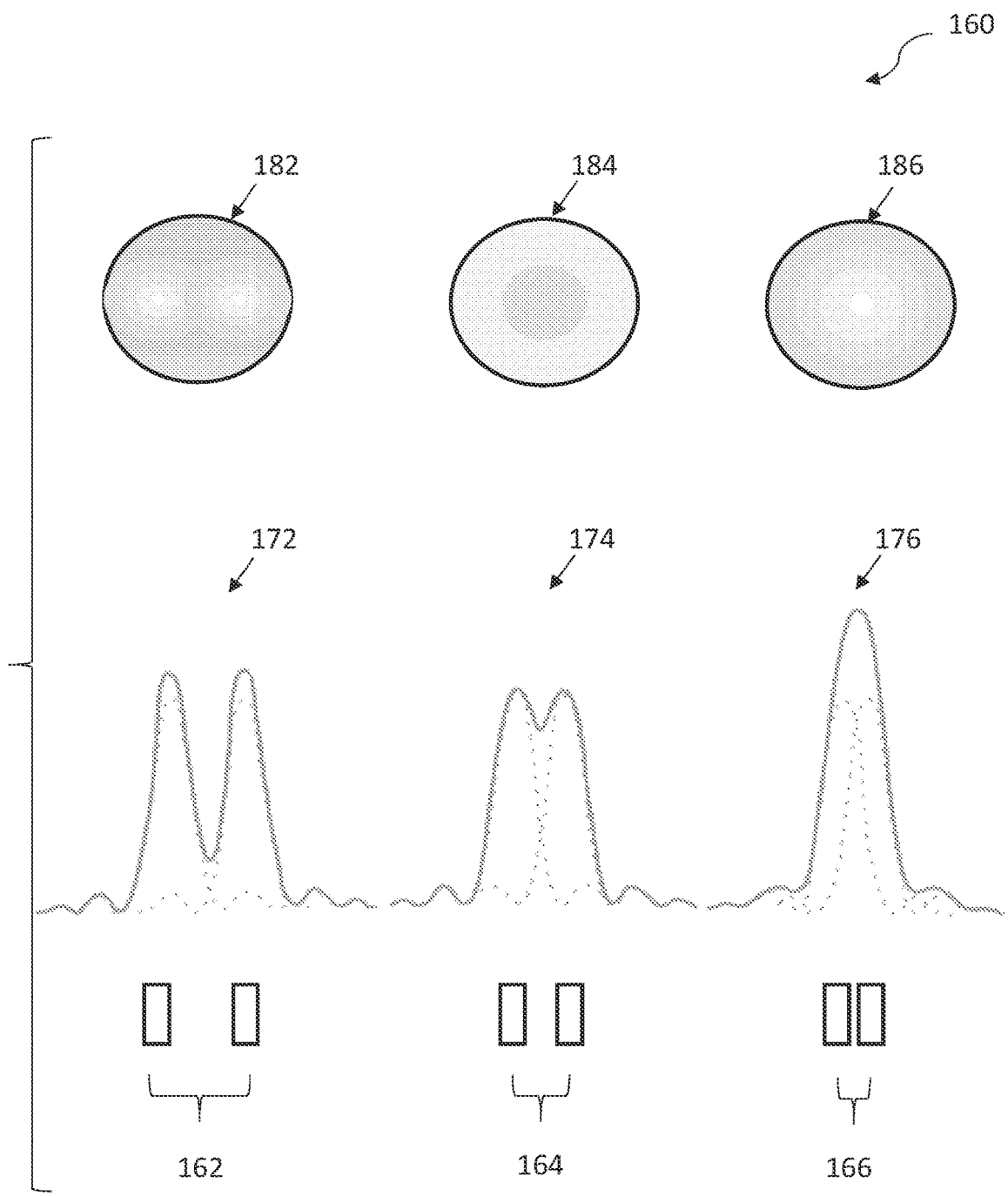
FIG. 1B is a diagram illustrating a Rayleigh distance separation of millimeter-scale spaced apart LEDs and micro-optics.

In one embodiment, LEDS are situated no further apart from each other than is necessary to present a substantially uniform visual appearance and provide a substantially uniform light beam. This requires that point-like sources be separated by distance that defines an angle smaller than the resolvable angular resolution for a user viewing at a normal distance (e.g. the distance from a standing or sitting user to light in a ceiling). FIG. 1B illustrates this with a graphic 160 illustrating a Rayleigh distance separation of millimeter-scale spaced apart LEDs and micro-optics. As seen in graph 160, pairs of LEDs 162, 164, and 166 are separated by an increasingly smaller distance. LEDs 162 are separated from each other by a distance and corresponding viewable angular separation at a distance (e.g. typically 1-2 meters) sufficient to distinguish each LED as a separate light source. A user looking at the LEDs would clearly see two distinct bright spots 182 having distinct dual light intensity peaks 172.

Placing the LEDs closer together can eliminate the perception of distinct bright spots. LEDs 166 are so closely spaced that the individual light intensity peaks from each LED beam are combined into a single peak 176 that presents a generally uniform visual impression, with some slight brightening 186 in the center.

Placing the LEDs 164 at an intermediate distance determined to be a Rayleigh distance separation or smaller can provide light intensity peaks 174 that are basically indistinguishable, giving a generally uniform visual impression 184. Rayleigh distance can be determined by considering diffraction through a circular aperture, which is:

$$\theta = 1.220 \frac{\lambda}{D}$$

where θ is the angular resolution (radians), λ is the wavelength of light, and D is the pupil diameter of a user viewing the separated LEDs. Determining the Rayleigh distance allows a further determination of LED spacing for a user viewing the LEDs at a distance typically between 1-2 meters distant. Typically, this LED separation distance will be 1 millimeter or less for sub-millimeter sized LEDs with associated micro-optics. In some embodiments, this distance can be increased by providing diffuser layers, wide beam optics, or mirror systems. Unfortunately, this reduces ease of manufacture and increases both the Z-height and expense of the LED systems.

Figure 1C:
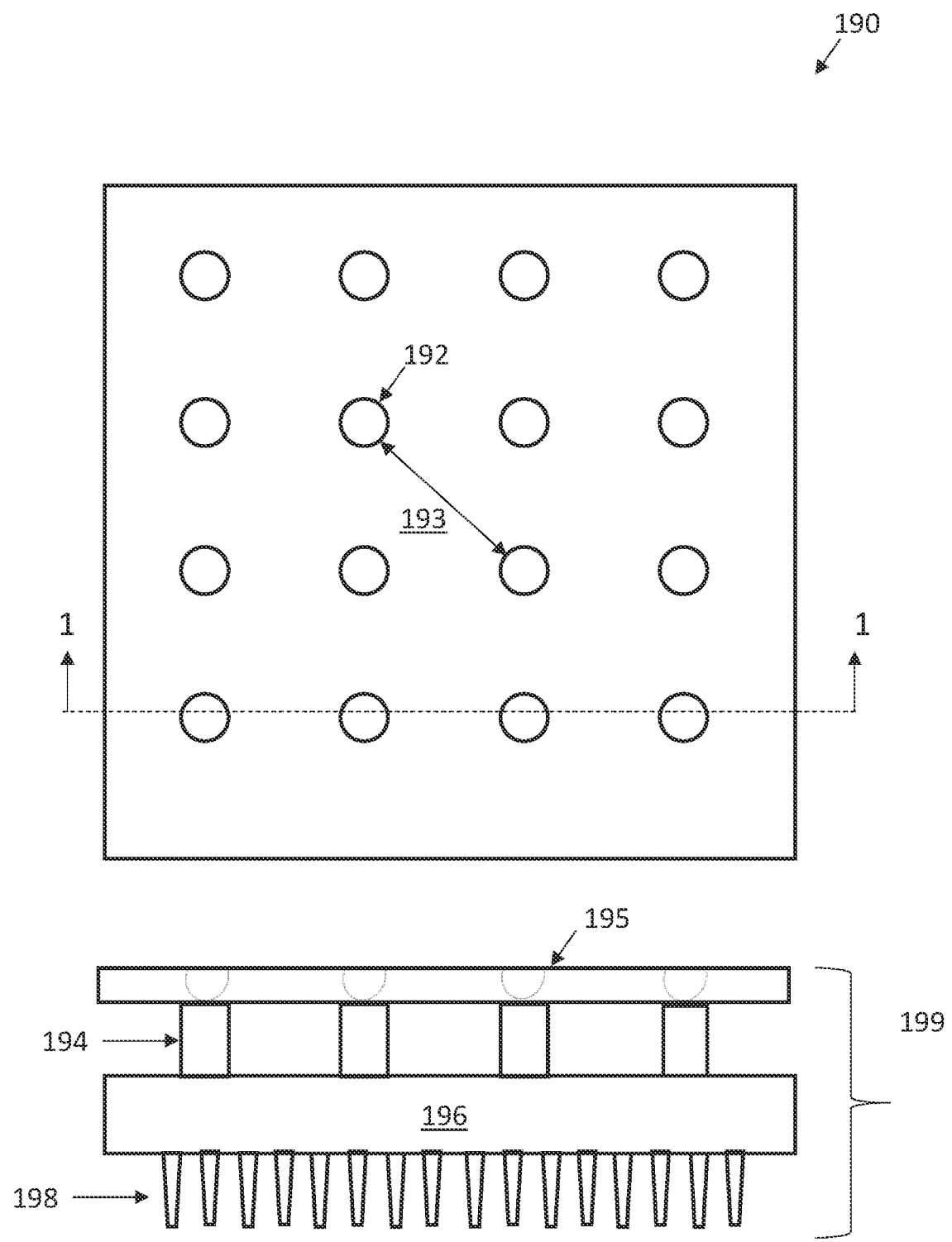
FIG. 1C is a diagram illustrating a low Z-height LED illumination system with multiple millimeter-scale spaced apart LEDs and micro-optics supported by a substrate.

FIG. 1C is a diagram illustrating a low Z-height LED illumination system 190 with multiple millimeter-scale spaced apart LED units 192 formed from a combination of LEDs 194 and sheet embedded micro-optics 195. The LEDs 194 are supported by a substrate 196 (e.g. a printed circuit board or ceramic substrate that supports electrical traces or vias) that has attached heat spreader fins 198. The total Z-height 199 of the system is minimized, with a Z-height typically being less than 1 centimeter for millimeter or less sized LED sources. In some embodiments, Z-height for the LED illumination system 190 is set to be no greater than five (5) times the height of the LEDs 194.

Figure 2:
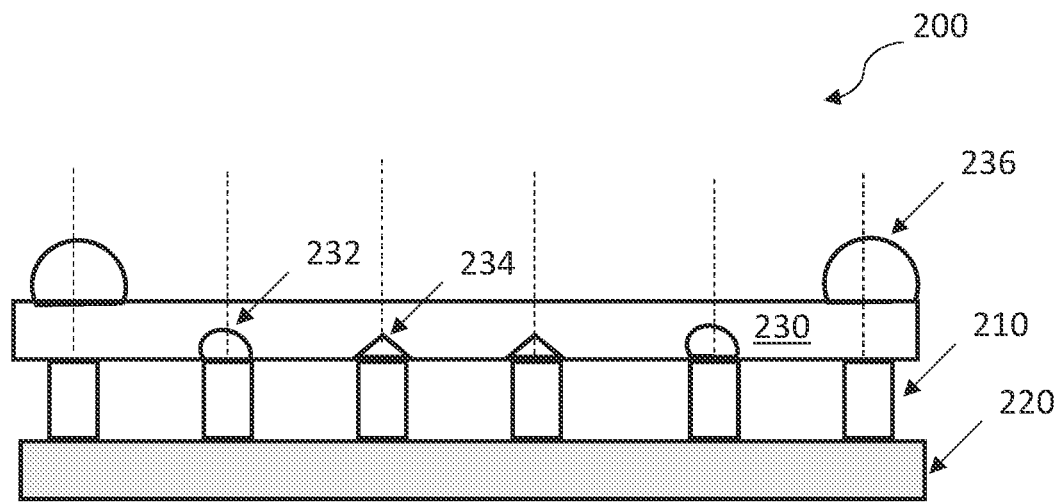
FIG. 2 illustrates a light guide plate with attached multiple millimeter-scale spaced apart LEDs and various micro-optics.

Low Z-height systems can support various light beam orientations. For example, FIG. 2 illustrates an illumination system 200 with multiple millimeter-scale spaced apart LEDs 210 supported on a substrate 220. The multiple millimeter-scale spaced apart LEDs can be symmetrically arranged in lines or arrays. Alternatively, they can be arranged to have non-symmetric, irregular spacing. Every LED 210, or selected subgroups of LEDs 210, can be spaced at a Rayleigh distance separation or smaller. One-dimensional, two-dimensional, and three-dimensional non-symmetric or irregular layouts of LEDs with associated micro-optics is contemplated. Two-dimensional layouts can be constructed from adjacent or contiguous positioning of one-dimensional substrates. Three-dimensional layouts can be constructed from multiple stacked layers of two-dimensional substrates. Stacked substrates can be transparent, or include defined apertures offset from supported LEDs to permit exit of light from lower layers. In other embodiments, symmetrical one-dimensional, two-dimensional, and/or three-dimensional arrays of LEDs can be used, as well as combinations of symmetrical and non-symmetrical layouts.

FIG. 2 also illustrates a light guide plate 230 formed to include optics or other light modification structures positioned near or adjacent to each of the LEDs 210. Optical structures can be defined by embossing, etching, or additive emplacement on one or both sides of the light guide plate. For example, circular cavities 232 or pyramidal cavities 234 can be defined on one side, with additively manufactured lens provided on the opposing side. Additionally, dots can be printed, lines scratched, or cavities etched to affect light exit from the light guide plate 230.

Figure 3:
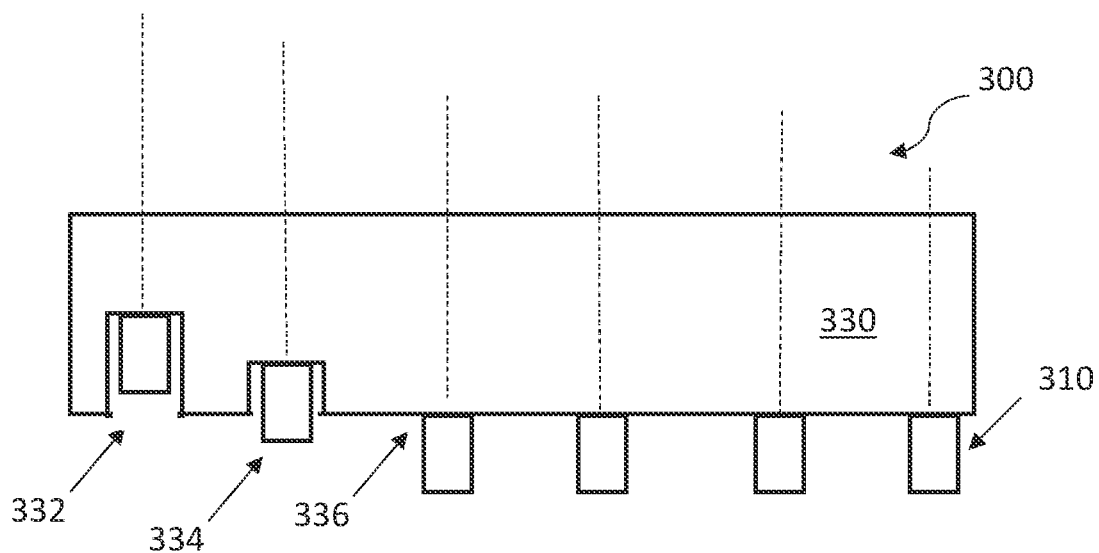
FIG. 3 illustrates a light guide plate with surface or cavity attached multiple millimeter-scale spaced apart LEDs.

FIG. 3 illustrates another embodiment of a low Z-height light guide plate system 300 in which LEDS 310 are attached directly to a light guide plate surface (336) or attached wholly (332) or partially (334) within a defined cavity in a light guide plate 330. Every LED 310, or selected subgroups of LEDs 310, can be spaced at a Rayleigh distance separation or smaller. In some embodiments, the light guide plate has a thickness from 50 to 100 microns, 100 to 500 microns, 0.5 to 1 mm, 1 mm to 5 mm, or 5 mm to 10 mm. In certain embodiments, LEDs 310 have a width from 30 microns to 500 microns. In other embodiments, LEDs 310 have a width and/or length from 5 to 10 μm, 10 to 50 μm, or 50 to 500 μm. In certain embodiments, each of the LEDs 310 has with a height from 2 to 10 μm, 10 to 200 μm, or 200 to 500 μm.

Attachment methods may include adhesive attachment. In some embodiments, pick and place machines can be used to individually position LEDs 310. In other embodiments, transfer forms or tacky sheets can be used to transfer multiple LEDs at the same time. In those embodiments including cavity attachment sites, numbers of LEDs can be placed and mechanically shaken on the light guide plate until the LEDs drop into suitable cavities. As other examples, elastomer stamps or electrostatic stamp (or other transfer device), can be used for pick-up and transport to a light guide plate. In some embodiments this process can be performed in in parallel, with dozens to hundreds LEDs transferred in a single pick-up-and-print operation.

LED power and control can be provided by applied conductive traces that are connected to suitable control and power circuitry. The conductive traces can be formed from conductive inks, conductive polymers, solder, conducting graphene, or other suitable material that can be lithographically or directly printed, or applied by stamping, or other suitable application method.

Figure 4A:
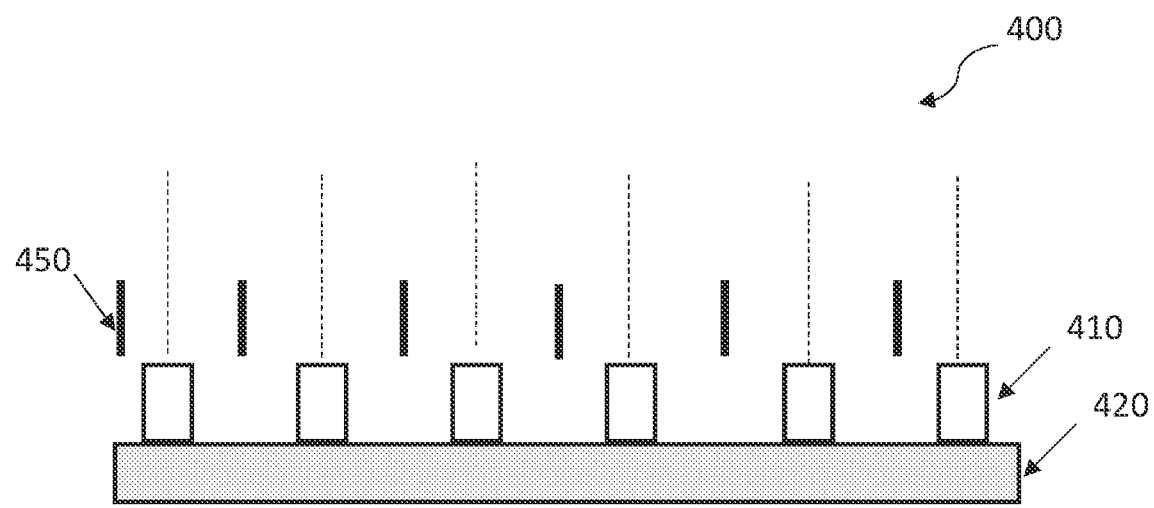
FIGS. 4A and 4B illustrates in respective side and top view a LED illumination system with multiple millimeter-scale spaced apart LEDs and an overlaying glare shield.
Figure 4B:
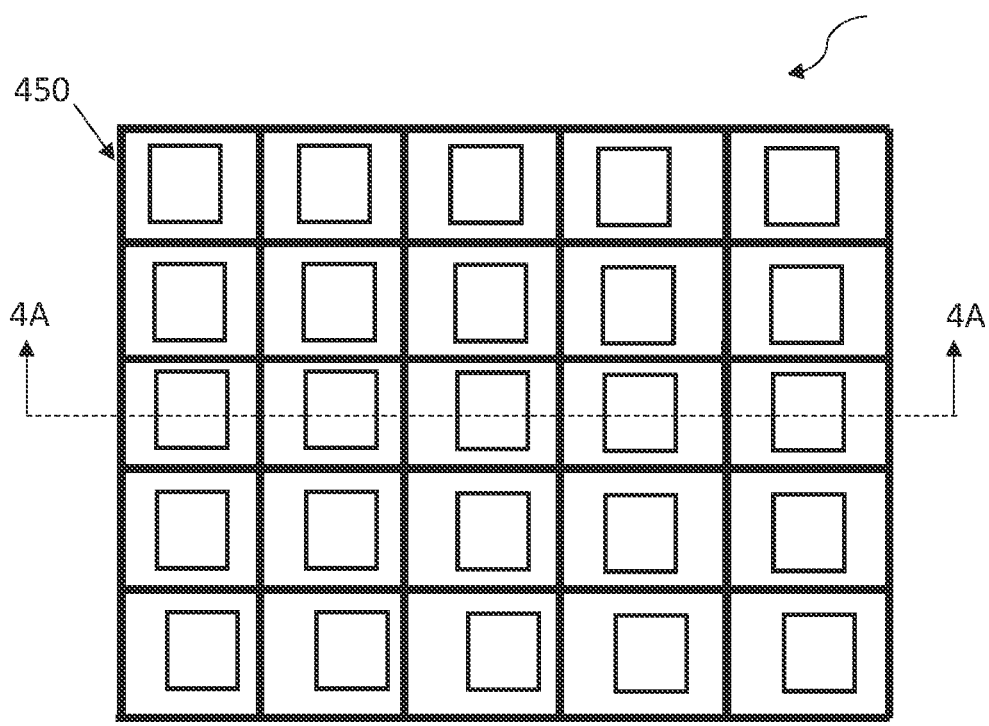

FIGS. 4A and 4B respectively illustrate in side (FIG. 4A) and top view (FIG. 4B) another embodiment 400. A low profile glare reduction structure 450 is situated over LEDs 410 that are attached to a substrate 420. Shields can be formed from a light blocking or reflective material the limits glare by reducing off-axis light beams. Every LED 210, or selected subgroups of LEDs 210, can be spaced at a Rayleigh distance separation or smaller.

Figure 5:
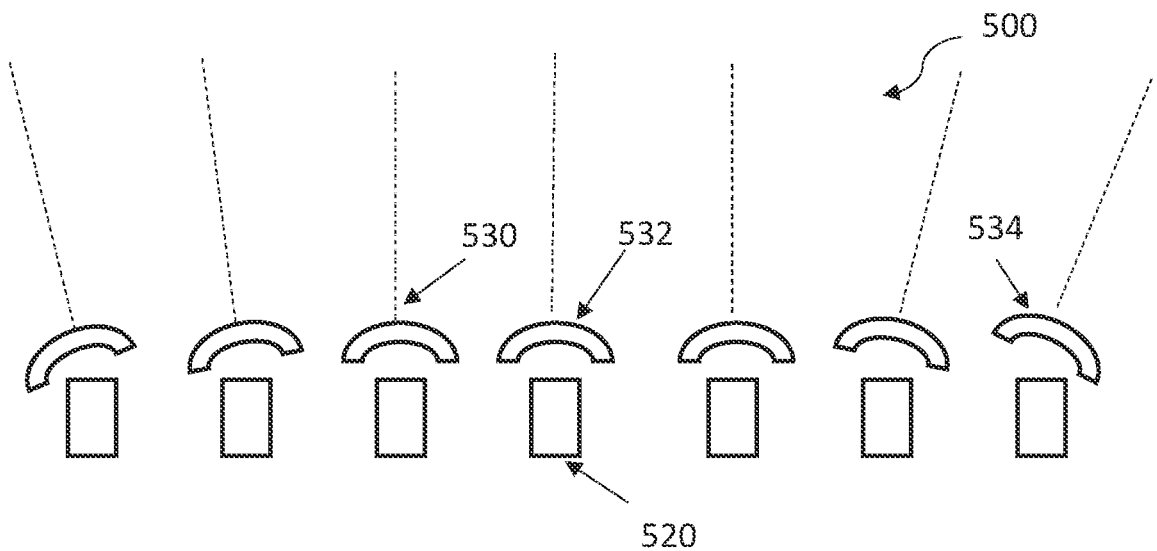
FIG. 5 illustrates multiple millimeter-scale spaced apart LEDs and micro-optics with both on-axis and off-axis associated micro-optics.

FIG. 5 illustrates an illumination system 500 with multiple millimeter-scale spaced apart LEDs 520 and micro-optics 530 with both on-axis (e.g. micro-optic 532) and off-axis (e.g. micro-optic 532) associated micro-optics.

Figure 6:
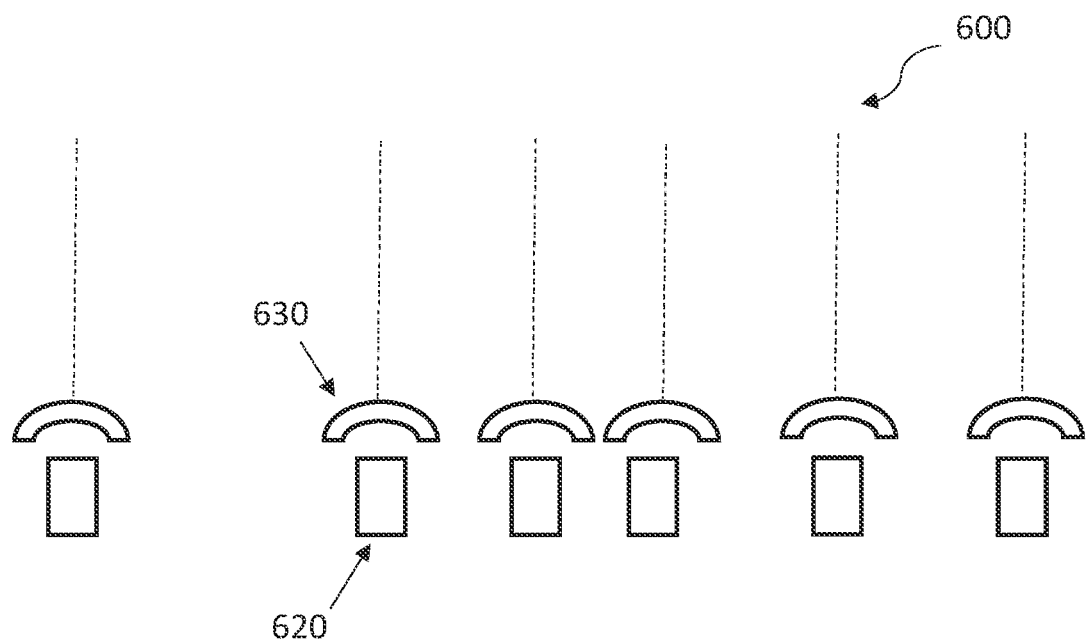
FIG. 6 illustrates multiple millimeter-scale spaced apart LEDs with associated micro-optics, arranged to have non-symmetric, irregular spacing.

FIG. 6 illustrates an illumination system 600 with multiple millimeter-scale spaced apart LEDs 320 with associated micro-optics 330, arranged to have non-symmetric, irregular spacing. One-dimensional, two-dimensional, and three-dimensional non-symmetric or irregular layouts of LEDs 620 with associated micro-optics 630 is contemplated. Two-dimensional layouts can be constructed from adjacent or contiguous positioning of one-dimensional substrates. Three-dimensional layouts can be constructed from multiple stacked layers of two-dimensional substrates. Stacked substrates can be transparent, or include defined apertures offset from supported LEDs 620 to permit exit of light from lower layers. In other embodiments, symmetrical one-dimensional, two-dimensional, and/or three-dimensional arrays of LEDs 320 can be used, as well as combinations of symmetrical and non-symmetrical layouts.

Figure 7:
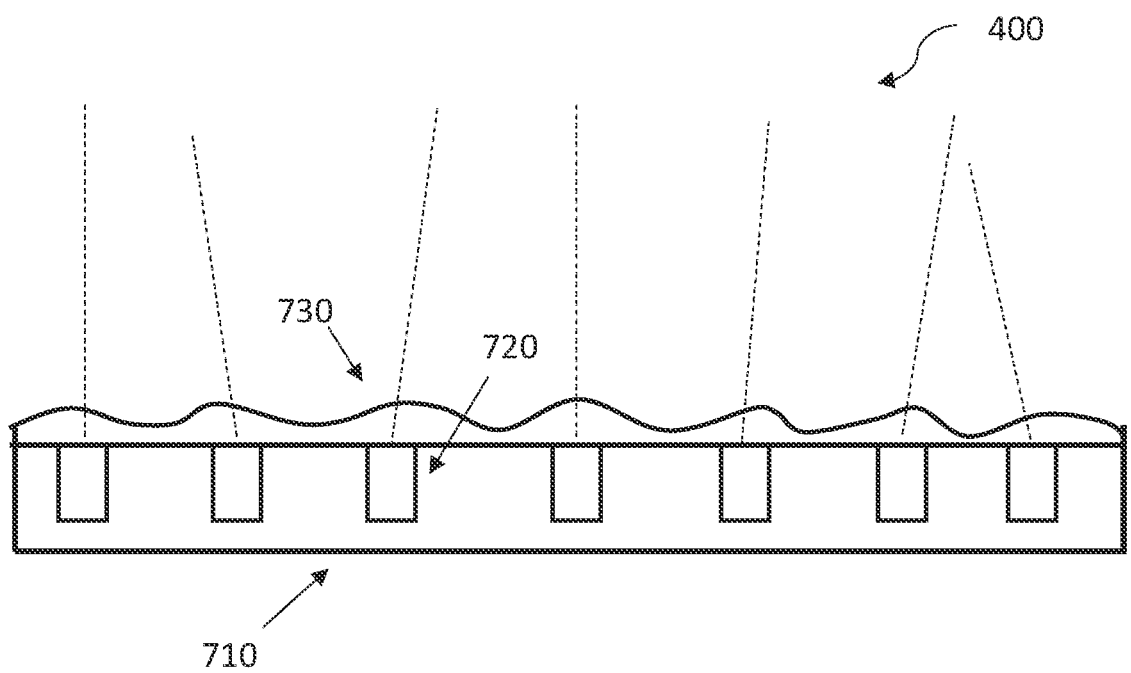
FIG. 7 illustrates multiple millimeter-scale spaced apart LEDs embedded in a substrate, with an overlaying continuous optical plate including aspheric optics.

FIG. 7 illustrates an illumination system 700 with multiple millimeter-scale spaced apart LEDs 720 embedded in a substrate 710, with an overlaying continuous optical plate 720 including aspheric optics. LEDs 720 can be positioned by a pick and place machine or other suitable carrier in multiple holes defined in substrate 410, Alternatively, epoxy, thermoset plastics, plastic molds, or similar substrates can be defined around LEDs 420 held in position. The plate 720 can be adhesively attached to the substrate 710. The plate can include on or off-axis micro-optics, or irregular aspheric micro-optics as shown. In certain embodiments, spherical optics can be used.

Figure 8:
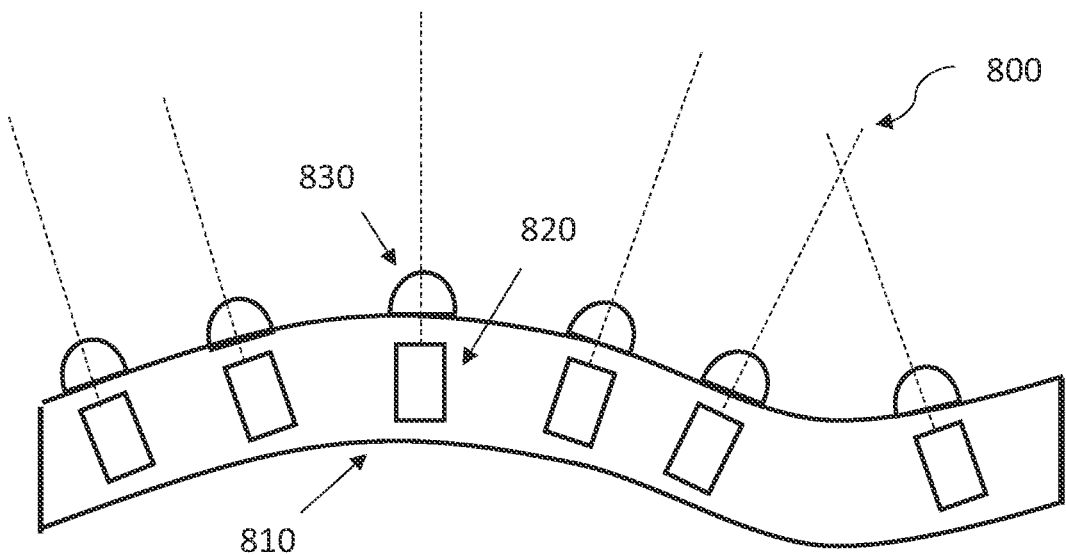
FIG. 8 illustrates multiple millimeter-scale spaced apart LEDs embedded in a flexible substrate.

FIG. 8 illustrates an illumination system 800 with multiple millimeter-scale spaced apart LEDs 520 embedded in a transparent, flexible substrate 810. Micro-optics 830 can be attached to the substrate 810. This design is of particular use for architectural applications that require corner or curved surface mounting.

Figure 9:
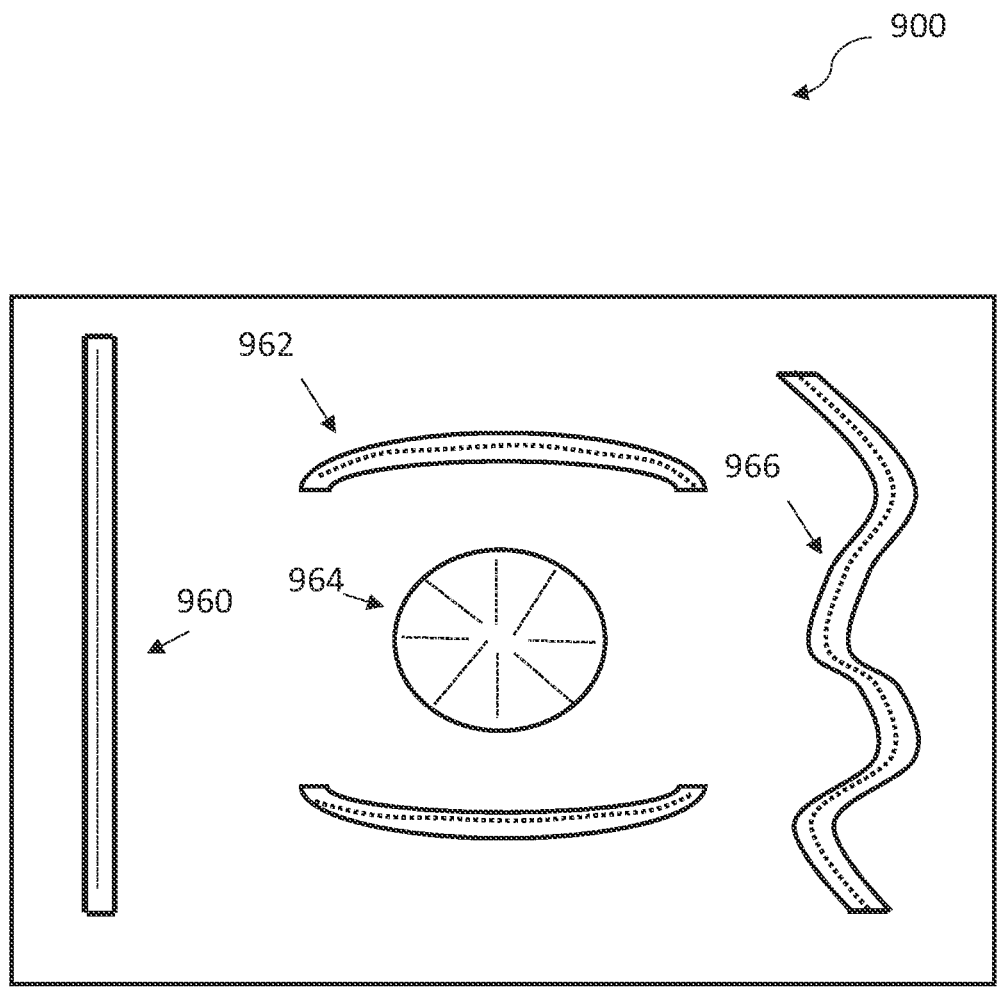
FIG. 9 is a top view illustrating two dimensional LED layout with filled areas, linear features, and regular and irregular curves.

FIG. 9 is a top view illustrating two dimensional LED layout with filled areas, linear features, and regular and irregular curves. For example, feature 960 is a narrow linear structure supporting a one-dimensional array of LEDs, while feature 962 supports a curved one-dimensional array of LEDs. Feature 964 is a two-dimensional array (which can be radially symmetric as shown). Alternatively, rectangular, clumped, spiral, or other layouts are supported. Feature 966 can be an irregular shaped curve.

Figure 10:
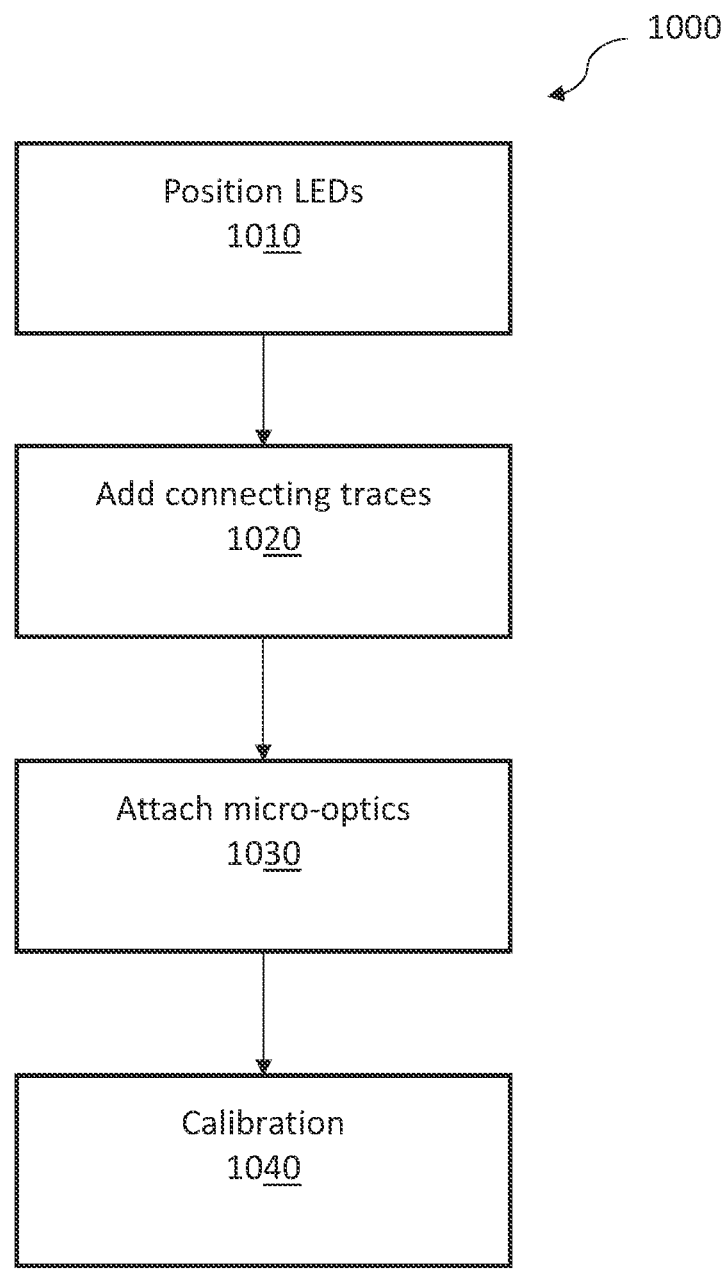
FIG. 10 illustrates a process for manufacture and calibration of multiple millimeter-scale spaced apart LEDs with associated micro-optics.

FIG. 10 illustrates a process 1000 for manufacture and calibration of multiple millimeter-scale spaced apart LEDs with associated micro-optics. In a first step 1010 are positioned with respect to a supporting substrate. A pick and place machine or other suitable device for holding and positioning hundreds or thousands of LEDs can be used. In step 1020, connecting traces are attached to the LEDs to allow later attachment to a controller. In step 1030, micro-optics are attached. In step 1040, calibration of intensity and light beam width/direction is conducted to correct for non-operating LEDs or misaligned micro-optics.

The disclosed low Z-height systems can be used in various lighting applications. For example, downlights able to provide 1,500 lumens can be constructed with 300 mini LEDs of 0.2×0.2 mm and further being 25 d with 1.1 mm optic height. The specific light pattern can take any shape including line, square, or open circle. In another application, spotlights that are track mounted or ceiling recessed can be constructed to provide 1,500 lm with 300 mini LEDs of 0.2×0.2 mm and further being 15 d with 2.0 mm optic height. An optional 2 mm high glare shield can also be used. Such lights can be embedded in the track system or can become part of a suspended light system. In still another embodiment, high intensity stadium lights able to provide 10,000 lm units can be constructed from 1,250 LEDs/unit. Even such powerful lighting systems will only require a 2.0 mm optic height. Mobile lighting applications are also supported. For example, a camera flash system can be designed to use 100 LEDs sized from 0.1 to 0.2 mm. The LEDs can be of one or more colors, and can be arranged to be selectively activated to provide a required flash light intensity at a desired color temperature.

Programmable light emitting arrays such as disclosed herein may also support a wide range of applications that benefit from fine-grained intensity, spatial, and temporal control of light distribution. This may include, but is not limited to, precise spatial patterning of emitted light from blocks or individual LEDs. Depending on the application, emitted light may be spectrally distinct, adaptive over time, and/or environmentally responsive. In some embodiments, the light emitting arrays may provide pre-programmed light distribution in various intensity, spatial, or temporal patterns. The emitted light may be based at least in part on received sensor data and may be used for optical wireless communications. Associated optics may be distinct at single or multiple LED level. An example light emitting array may include a device having a commonly controlled central block of high intensity LEDS with an associated common optic, whereas edge positioned LEDs may have individual optics. Common applications supported by light emitting LED arrays include camera or video lighting, architectural and area illumination, and street lighting.

Programmable light emitting arrays may be used to selectively and adaptively illuminate buildings or areas for improved visual display or to reduce lighting costs. In addition, light emitting arrays may be used to project media facades for decorative motion or video effects. In conjunction with tracking sensors and/or cameras, selective illumination of areas around pedestrians may be possible. Spectrally distinct LEDs may be used to adjust the color temperature of lighting, as well as support wavelength specific horticultural illumination.

Street lighting is an important application that may greatly benefit from use of programmable light emitting arrays. A single type of light emitting array may be used to mimic various street light types, allowing, for example, switching between a Type I linear street light and a Type IV semicircular street light by appropriate activation or deactivation of selected LEDs. In addition, street lighting costs may be lowered by adjusting light beam intensity or distribution according to environmental conditions or time of use. For example, light intensity and area of distribution may be reduced when pedestrians are not present. If LEDs are spectrally distinct, the color temperature of the light may be adjusted according to respective daylight, twilight, or night conditions.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A light source comprising:
a plurality of light emitting diodes each having a light emitting surface sized between 30 microns and 500 microns; and
a plurality of micro-optics each having an optical axis and dimensions perpendicular to the optical axis of less than or equal to 1 millimeter, each micro-optic spaced apart from adjacent ones of the micro-optics by at least 1 millimeter, each micro-optic positioned over at least one of the plurality of light emitting diodes to collect and direct light emitted through its light emitting surface, at least some of the micro-optics oriented with their optical axes at an angle other than 90 degrees with respect to the light emitting surfaces of the light emitting diodes over which they are positioned.

2. The light source of claim 1, wherein the light emitting diodes are independently operable.

3. The light source of claim 1, wherein at least some of the micro-optics and the light emitting diodes over which they are positioned are grouped into two or more groups to provide corresponding directional light beams, comprising a controller connected to selectively power the light emitting diodes within the groups to provide different light beam patterns.

4. The light source of claim 3, wherein the light emitting diodes within the groups are independently operable.

5. The light source of claim 3, wherein the micro-optics within each group are positioned at distances from each other sufficiently close that the directional light beam provided by the group is substantially uniform at a distance of 1 meter to 2 meters from the light source.

6. The light source of claim 1, comprising a flexible substrate positioned to support the plurality of light emitting diodes and the plurality of micro-optics, the flexible substrate bendable to allow differing directionality of light beams.

7. The light source of claim 1, comprising a flexible light guide plate defining the plurality of micro-optics.

8. The light source of claim 1, wherein the micro-optics have a same shape as each other.

9. The light source of claim 1, wherein a thickness of the light source perpendicular to the light emitting surfaces is less than or equal to 1 centimeter.

10. The light source of claim 1, wherein at least one of the micro-optics is positioned over two or more of the light emitting diodes.

11. The light source of claim 10, wherein each of the two or more light emitting diodes is independently operable.

12. The light source of claim 1, wherein at least one of the micro-optics is positioned over a group of four of the light emitting diodes comprising a red light emitting diode, a blue light emitting diode, a green light emitting diode, and a yellow light emitting diode, each of which is independently operable to control a color of light collected and directed by the micro-optic.

13. A light source comprising:
a plurality of light emitting diodes each having a light emitting surface sized between 30 microns and 500 microns;
a plurality of micro-optics each spaced apart from adjacent ones of the micro-optics by at least 1 millimeter apart from each other, each of the micro-optics having an optical axis and dimensions perpendicular to the optical axis of less than or equal to 1 millimeter, each micro-optic positioned over at least one of the plurality of light emitting diodes to collect and direct light emitted through its light emitting surface, at least some of the micro-optics oriented with their optical axes at an angle other than 90 degrees with respect to the light emitting surfaces of the light emitting diodes over which they positioned; and
a flexible substrate positioned to support the plurality of light emitting diodes and the plurality of micro-optics, the flexible substrate bendable to allow differing directionality of light beams.

14. The light source of claim 13, wherein a thickness of the light source perpendicular to the light emitting surfaces is less than or equal to 1 centimeter.

15. The light source of claim 14, wherein the light emitting diodes are independently operable.

16. The light source of claim 14, wherein at least one of the micro-optics is positioned over two or more of the light emitting diodes.

* * * * *